United States Patent
Bauer et al.

(10) Patent No.: US 12,452,992 B2
(45) Date of Patent: Oct. 21, 2025

(54) POWER MODULE HAVING REDUCED INTRINSIC INDUCTANCE

(71) Applicant: AVL Software and Functions GmbH, Regensburg (DE)

(72) Inventors: Christoph Bauer, Regensburg (DE); Peter Weiss, Regensburg (DE)

(73) Assignee: AVL Software and Functions GmbH, Regensburg (DE)

( * ) Notice: Subject to any disclaimer, the term of this patent is extended or adjusted under 35 U.S.C. 154(b) by 0 days.

(21) Appl. No.: 18/648,649

(22) Filed: Apr. 29, 2024

(65) Prior Publication Data

US 2024/0276633 A1  Aug. 15, 2024

Related U.S. Application Data

(63) Continuation of application No. 17/590,980, filed on Feb. 2, 2022, now abandoned.

(30) Foreign Application Priority Data

Feb. 9, 2021 (DE) .......................... 102021102924.4

(51) Int. Cl.
*H05K 1/02* (2006.01)
*H05K 1/18* (2006.01)

(52) U.S. Cl.
CPC .......... *H05K 1/0213* (2013.01); *H05K 1/181* (2013.01)

(58) Field of Classification Search
CPC .......... H05K 1/02; H05K 1/0213; H05K 1/18; H05K 1/181–187; H01L 23/36; H01L 23/62; H01L 23/485; H01L 23/552; H01L 23/645; H02M 1/00; H02M 1/327; H02M 7/003

USPC .............. 361/690–710, 775–784, 803, 813; 439/76.2, 76.1

See application file for complete search history.

(56) References Cited

U.S. PATENT DOCUMENTS

| | | | |
|---|---|---|---|
| 9,373,617 B2 * | 6/2016 | Das | H01L 21/046 |
| 10,403,558 B2 | 9/2019 | Xu et al. | |
| 2012/0014069 A1 * | 1/2012 | Zeng | H01L 25/115 |
| | | | 29/841 |
| 2014/0152373 A1 * | 6/2014 | Romas, Jr. | H01L 25/18 |
| | | | 327/374 |

(Continued)

FOREIGN PATENT DOCUMENTS

CN  109427720 A  3/2019

OTHER PUBLICATIONS

Office Action re: Chinese Appln. No. 2022101208872; May 30, 2025; 8 pages; China National Intellectual Property Administration; Beijing, China; Translation unavailable. Cited documents submitted herewith.

*Primary Examiner* — Tuan T Dinh
(74) *Attorney, Agent, or Firm* — Rogue.law; Laura Schneider

(57) ABSTRACT

A power module having reduced intrinsic inductance has an at least partially electrically insulating layer that has a first surface on which a power electronics unit is arranged and a second surface which is opposite the first surface. The module also has a compensation layer arranged on the second surface, which the compensation layer is electrically conductive and which the compensation layer is electrically connected to the electric potential of the power electronics unit.

9 Claims, 3 Drawing Sheets

(56) References Cited

U.S. PATENT DOCUMENTS

| | | | | |
|---|---|---|---|---|
| 2015/0173248 A1* | 6/2015 | Zeng | ............... | H05K 7/14329 |
| | | | | 361/709 |
| 2016/0247735 A1* | 8/2016 | Lin | ............... | H01L 23/492 |
| 2016/0352247 A1* | 12/2016 | Li | ............... | H01L 25/18 |
| 2017/0154877 A1* | 6/2017 | Tanimoto | ............ | H01L 23/3735 |
| 2018/0047649 A1* | 2/2018 | Bando | ............. | H01L 23/053 |
| 2018/0366400 A1* | 12/2018 | Mohn | ............... | H01L 25/072 |
| 2019/0067160 A1* | 2/2019 | Xu | ............... | H01L 23/3735 |
| 2020/0294883 A1* | 9/2020 | Dede | ............... | H01L 23/3107 |

\* cited by examiner

POWER MODULE HAVING REDUCED INTRINSIC INDUCTANCE

PRIORITY INFORMATION

This application is a continuation of U.S. patent application Ser. No. 17/590,980 filed on Feb. 2, 2022 and entitled "Power Module Having Reduced Intrinsic Inductance," which claims foreign priority to German Application No. DE102021102924.4 filed on Feb. 9, 2021 and entitled "Leistungsmodul mit reduzierter intrinsischer Induktivitaet," the entire contents of which are hereby incorporated by reference for all proper purposes.

DESCRIPTION

The invention relates to a power module having reduced intrinsic inductance. A power module of this kind has a power electronics unit arranged on a substrate. The invention also relates to a method for producing a power module of this kind having reduced intrinsic inductance.

A power electronics unit is used to convert electrical energy using switching electronic components. Power electronics units are used, for example, as converters or variable frequency drives in the field of electrical drive technology, solar inverters and converters for wind turbines or switched-mode power supplies. Power electronics units are of vital importance in the field of electromobility and renewable energy sources in particular.

For example, at least part of the drive power is provided by an electric motor in hybrid vehicles or electric vehicles. In these systems, the electrical energy is often converted to the appropriate voltage and frequency for the electrical drive motor by means of power electronics units. For this purpose, DC-to-DC converters and inverters can be used, which also process (in hybrid vehicles, the energy from the internal combustion engine and/or braking energy through regeneration) for intermediate storage in accumulators when the electric motor is operating as a generator.

Power electronics units are used, for example, in rectifiers, inverters, DC voltage converters (DC-DC converters) or variable frequency drives. Power electronics units are often used as power modules for easy replaceability. In the case of power modules, (at least) one power electronics unit is arranged on an electrically insulating substrate. Due to the often very high voltages and/or current intensities that must be handled by the power electronics unit, the power electronics unit in such power modules is often surrounded by a closed housing through which only the electronics connections pass. The voltages to be handled are often in the range of 300-10000 V and/or 20-3000 A. Bipolar transistors having an insulated gate electrode, or IGBT (insulated-gate bipolar transistor), are preferably used in power modules. These are particularly suitable due to their good conductive behaviour, high reverse voltage and robustness.

Due to the growing importance of the above-mentioned fields, there is increased demand on the performance, efficiency, (long-term) ampacity, reliability and manageability of power electronics units. There is thus a need to provide a power module which, compared with the power modules known from the prior art, represents an improvement over the prior art with regard to at least one of the above-mentioned requirements, preferably with regard to several of the above-mentioned requirements. Furthermore, the invention addresses the problem of providing a method for producing such a power electronics unit.

This problem is solved by the subject matter of the independent claims.

One solution to the problem addressed by the invention is therefore a power module having reduced intrinsic inductance, comprising an at least partially electrically insulating layer that has a first side on which a power electronics unit is arranged and a second side which is opposite the first side. According to the invention, a compensation layer is arranged on the second side, which compensation layer is electrically conductive and to which compensation layer an electric potential can be applied. It has surprisingly been shown that the intrinsic inductance of a power module can be reduced by an electrically conductive compensation layer to which an electric potential is applied.

Since the inductance of an electrical component is proportional to the applied voltage, the inductance was found to be essential for optimising the performance, efficiency, (long-term) ampacity, reliability and/or manageability, in particular for power modules which are used in higher voltage ranges. The intrinsic inductance of a power module can be reduced by a compensation layer as described above.

The power electronics unit preferably substantially has a layer structure. This makes it particularly easy to arrange a compensation layer in such a way that it compensates for the intrinsic inductance particularly effectively. To this end, it has proven to be particularly advantageous to arrange the power electronics unit and the compensation layer parallel to one another over as large a region as possible. The power electronics unit can comprise a plurality of layers and preferably comprises a large number of layers. The layer structure preferably comprises at least one layer which is selected from a group comprising silicon, silicon carbide and gallium nitrite.

These materials have been shown to be particularly suitable, individually or in combination with one another, for producing the electronic elements of a power electronics unit.

The insulating layer is preferably designed to be at least substantially planar. This makes it particularly easy to arrange the compensation layer parallel to a portion of the power electronics unit over as large a region as possible. In particular, it is preferable for the insulating layer to extend at least partially parallel to a layer (as described above) of the power electronics unit (which has a layer structure). This simplifies the arrangement of the compensation layer in a particularly efficient alignment with the power electronics unit.

The compensation layer preferably comprises a metal or is preferably made of metal or a metal alloy. This has proven to be particularly advantageous in terms of manageability and electrical connection. In addition, this often also allows an advantageous thermal connection.

The number of compensation layers in a power module can be selected on the basis of the desired reduction in the intrinsic inductance. A single compensation layer per power module has proven to be efficient for a large number of applications, since this alone often allows a significant reduction in the intrinsic inductance and both the costs and the additional construction volume can be kept low. In another preferred embodiment, the number of compensation layers is between 2 and 200, preferably between 2 and 100, more preferably between 3 and 50, particularly preferably between 3 and 20. This embodiment allows a further reduction in the intrinsic inductance. If there is a plurality of compensation layers, two or more of these compensation layers can have the same geometry or mutually different geometries. If there is a plurality of compensation layers, it is conceivable, for example, for a compensation layer to substantially have a geometry that corresponds to the shape of an adjacent power electronics unit conductor track. Another compensation layer could be designed as a flat layer, for example.

Alternatively, or in addition, different compensation layers could differ in thickness (or height), namely in their extension perpendicular to the two mutually perpendicular main extension directions. A compensation layer preferably has a thickness (or height) which is in the range of 10 nm-10 mm, preferably 1 µm-5 mm, particularly preferably 10 µm-1 mm. These thicknesses have proven to be advantageous in terms of manageability, additional material input, costs and/or reduction of the intrinsic inductance.

The insulating layer can be a substrate or a coating for the power electronics unit (or part of the power electronics unit). Regardless, the insulating layer can comprise various materials. Materials selected from a group comprising polymers, composite materials, in particular (glass- or stone-)fibre-reinforced plastics and ceramics are conceivable, for example. In particular, it is preferable for the insulating layer to be a substrate for the power electronics unit and at least substantially formed from a ceramic. An insulating layer could also separate different portions of the (power) electronics unit from one another. A stacked structure in which an insulating layer at least partially electrically shields a first power electronics unit from a second power electronics unit would be conceivable, for example. In this case, too, the insulating layer can act as a substrate for one or more power electronics units. It is also advantageous in this embodiment for the insulating layer to comprise a ceramic or consist of a ceramic.

Both the insulating layer and the compensation layer can be located (independently of one another) within a power module. In particular in the case of a power electronics unit with a layer structure, it is thus conceivable for the (preferably partially) insulating layer and/or the compensation layer to be arranged between individual layers of the power electronics unit.

A compensation layer can be located inside or outside a power module. A combination of compensation layers arranged inside and outside a power module is also conceivable. Depending on the location at which the intrinsic inductance occurs, the strength of the intrinsic inductance that occurs can be reduced by a corresponding selection of the location of the arrangement of a compensation layer.

The compensation layer is preferably electrically connected to an electric potential of the power electronics unit, particularly preferably to an electric potential of a switch. By applying such a potential, the intrinsic inductance of a power module can be reduced particularly efficiently.

In particular, it is preferable for the compensation layer to be electrically connected to a pole of a direct voltage source or, in the case of alternating voltage, to an outer conductor. This embodiment is particularly easy to implement and, moreover, provides independence from switching states within the power electronics unit.

The compensation layer is preferably divided into a plurality of portions. This configuration makes it possible to adapt the compensation for the intrinsic inductance to the locally occurring intrinsic inductance. For this purpose, it is particularly advantageous for the portions to be electrically insulated with respect to one another. Preferably, different electric potentials can be applied to these portions. These potentials are preferably adapted to the locally occurring intrinsic inductance to be compensated for. Potentials with opposite polarity signs are preferably applied to at least two (preferably adjacent) portions of the compensation layer. This makes it possible to adapt the compensation to the locally occurring intrinsic inductance, regardless of the potential required for this or the polarity sign of the potential to be applied.

In particular when a power module has a layered structure, it is advantageous for it to have a plurality of the layers that are at least partially electrically insulating, as described above. Each of these layers can have a compensation layer on a second side opposite the power electronics unit, which compensation layer is electrically conductive and to which compensation layer an electric potential can be applied. This makes it possible to compensate for the intrinsic inductance at a plurality of locations within the power module. This prevents mutual influencing and in particular amplification by the intrinsic inductance generated by different components of the power electronics unit or the power module. The intrinsic inductance caused by individual or multiple elements of the power electronics unit or the power module can thus be compensated locally.

At least two of the plurality of portions of a compensation layer and/or of the plurality of compensation layers preferably have a mutually different geometry. These different geometries of the portions and/or compensation layers can also improve the efficiency of the compensation for the locally occurring intrinsic inductance.

In this regard, it would be conceivable, for example, for a portion and/or a compensation layer to at least approximately mirror substantially the shape of the conductor tracks of a layer of the power electronics unit that is opposite the insulating layer. In a preferred embodiment, the compensation layer has a conductor track structure, at least partially. This conductor track structure preferably corresponds to the conductor track structure of the layer of the power electronics unit which is directly opposite the insulating layer.

An embodiment in which the compensation layer is not only electrically conductive, but also thermally conductive, has been shown to be particularly preferable. In such a configuration, the compensation layer can be used to dissipate heat from the power electronics unit as well as to compensate for the intrinsic inductance. For this purpose, the compensation layer is preferably thermally connected to a heat sink. The thermal connection to the heat sink could be provided, for example, by means of a fluid medium. Air and water have proven to be particularly suitable in this regard, as they are available in sufficient quantities almost everywhere. Alternatively, or in addition, mixtures of water with other fluids, preferably antifreeze, particularly preferably glycol, have also proven to be advantageous. Depending on the requirements, for example depending on the (ambient and/or working) temperature or the required heat capacity, the fluids can be used in various mixing ratios between 99:1 and 1:99. Mixing ratios from 80:1 to 1:80, preferably from 75:1 to 1:75, more preferably from 60:1 to 1:60, particularly preferably 50:50 (possible deviations of ±5 wt. %, preferably ±2 wt. %, of a constituent can be tolerated) have shown to be particularly preferable. Additionally, or alternatively, a fluid medium comprising an oil can be advantageous in some applications. This has proven to be advantageous in particular because of the low or negligible conductivity of some oils when an electric potential is applied to a compensation layer.

The fluid medium is preferably accelerated along a heat transfer surface of the compensation layer by means of a corresponding acceleration device. The compensation layer preferably has a structure in the region of the heat transfer surface which enlarges the surface in comparison with the opposite surface facing the power electronics unit. Waves, fins or pins protruding into the fluid flow have proven to be particularly advantageous.

Furthermore, the problem addressed by the invention is solved by a method for producing a power module. In particular, a power module produced in this way is a power module as described above. The method is characterised by the following steps:

providing a power electronics unit comprising an at least partially electrically insulating layer which has a first side that faces the power electronics unit and an opposite second side that faces away from the power electronics unit, and depositing an electrically conductive compensation layer on the second side of the at least partially electrically insulating layer.

This method makes it possible to provide a power electronics unit having reduced intrinsic inductance.

If a power module has a layered structure, it is conceivable to combine a plurality of power electronics units. A plurality of power electronics units can be provided with a compensation layer as described above. In this regard, a layered structure in which a compensation layer is arranged between layers which comprise constituents of the power electronics unit is conceivable. Accordingly, it is conceivable and preferable to carry out the above-mentioned steps several times in order to produce a stack in which the power electronics unit and compensation layer alternate. In this case, however, it is not absolutely necessary for a compensation layer to be arranged between each layer comprising a power electronics unit. It would be conceivable, for example, for a compensation layer to only follow every second or third (optionally $4^{th}$-$10^{th}$ or even $20^{th}$) layer which comprises constituents of the power electronics unit.

The electrically conductive compensation layer is then preferably electrically connected to a pole of a direct voltage source or, in the case of alternating voltage, to an outer conductor. This connection allows the compensation layer (optionally after adjusting the applied voltage) to fully develop its potential for reducing the intrinsic inductance.

Additional aims, advantages and expedient uses of the present invention can be found in the following description in conjunction with the drawings, in which:

FIG. 1: is a detail of a power module according to a preferred embodiment.

Figure 1:
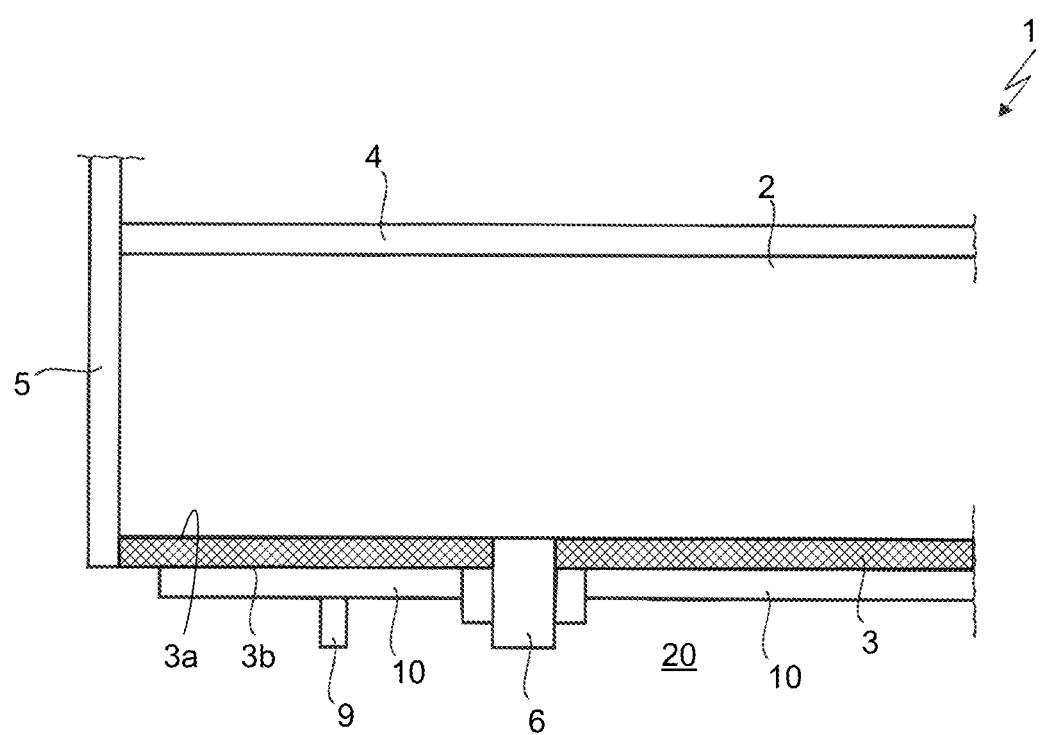

FIG. 1 is a detail of a power module 1, the individual constituents of the power electronics unit 2 not being shown. In a preferred embodiment, the power electronics unit is a multilayer (for example three-layer, preferably four-layer) semiconductor component, preferably an IGBT. The p- or n-doped regions of such a power electronics unit 2 are not shown.

In this schematic illustration of a detail, the power module 1 comprises only a single power electronics unit 2. This is arranged between two at least partially insulating layers 3 and 4. Together with further boundaries (only a lateral boundary 5 is shown), extensive insulation from the environment and thus protection against electric shock can be provided. The electrical insulation is preferably only interrupted by connections for the electrical connection of the power electronics unit. Only one such connection 6 is shown as an example.

A compensation layer 10 is arranged on the second side of the insulating layer 3 that faces away from the power electronics unit. This compensation layer is electrically conductive and has a connection 9 by means of which an electric potential can be applied to this compensation layer 10.

Figure 2:
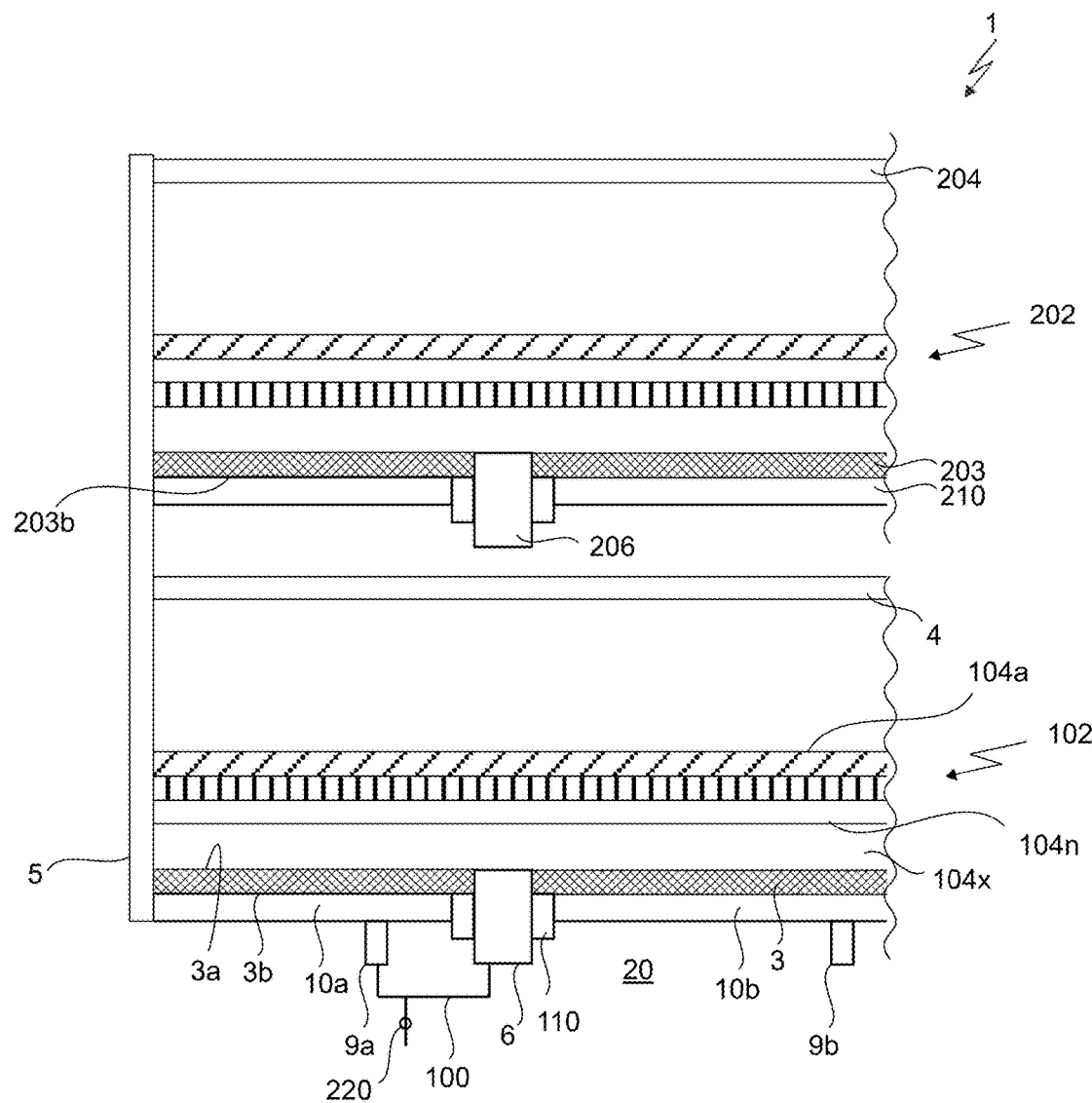
FIG. 2 is a detail view of a power module according to another embodiment.

Turning now to FIG. 2, a power module 1 having reduced intrinsic inductance is further described. The power module 1 has an at least partially electrically insulating layer 3 that has a first surface 3a on which a power electronics unit 2 is arranged and a second surface 3b which is opposite the first surface 3a. A compensation layer 10 is arranged on the second surface 3b. The compensation layer 10 is electrically conductive and is electrically connected (via connection 100) to the electric potential of the power electronics unit 2.

In some embodiments, the power electronics unit 2 substantially has a layer structure 102. The layer structure may have a layer 104a, 104n or 104x selected from a group comprising silicon, silicon carbide, and gallium nitrite.

In some embodiments, the insulating layer 3 is at least substantially planar. The insulating layer 3 may extend parallel to a layer 104 of the power electronics unit 2.

In some embodiments, the compensation layer 10 is electrically connected to the electric potential (via pin 9a, the connection 100 and pin 6) of a switch 220 of the power electronics unit 2, layer 104x.

In some embodiments, the compensation layer is divided into a plurality of portions 10a, 10b, these portions being electrically insulated (by isolators 110) from one another and to allow different electric potentials to be applied to these portions (via pins 9a and 9b). The electric potentials may have opposite polarity signs.

In some embodiments, the power module 1 has a plurality of at least partially electrically insulating layers 3, 203, each of these layers having, on a second surface 3b, 203b opposite the power electronics 2, 202 unit, a further compensation layer 210, wherein the further compensation layer is electrically conductive and an electric potential is applicable to the further compensation layer 210.

In some embodiments, at least a portion of the compensation layer has a geometry shaped and configured to correspond to the power electronics unit. See, for example, layer 3, shaped to accommodate connection 6, in contrast to layer 104x, which is flat. See also layer 3 and layer 4 in FIG. 1.

In some embodiments, the compensation layer 3 is thermally conductive and is thermally connected to a heat sink, which may be a fluid 20 in order to dissipate heat from the power electronics unit 2.

Figure 3:
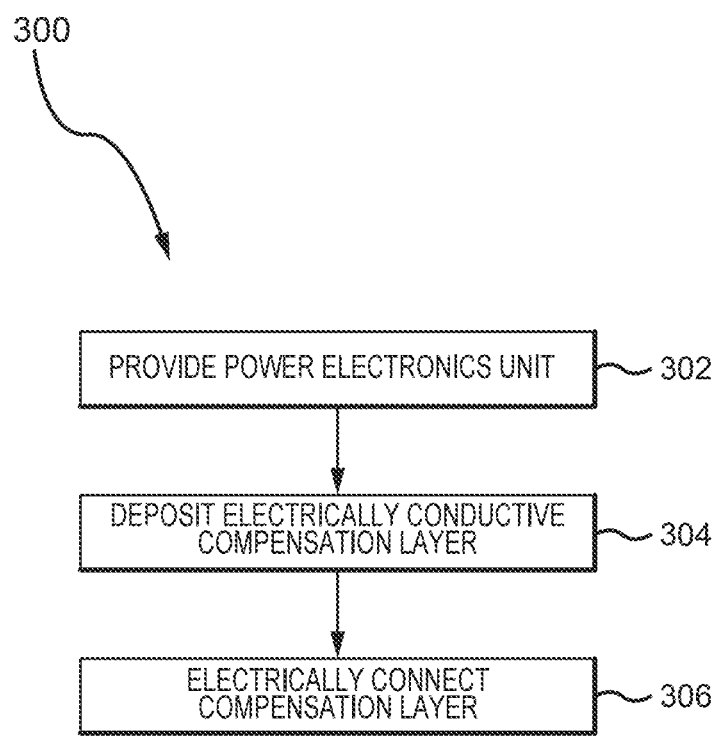
FIG. 3 is a flowchart of an embodiment of a method disclosed herein.

Turning now to FIG. 3, a method 300 for producing a power module is described. The method 300 includes providing 302 a power electronics unit 2 comprising an at least partially electrically insulating layer 3 which has a first surface 3a that faces a power electronics 2 and an opposite second surface 3b that faces away from the power electronics 2; depositing 304 an electrically conductive compensation layer 10 on the second surface 3b of the at least partially electrically insulating layer 3; and electrically connecting 306 the compensation layer 10 to an electric potential of the power electronics unit. Electrically connecting 306 may be achieved via pins 6, 9 and connection 100.

In some embodiments of the method 300, the compensation layer 10 is electrically connected to a pole of a direct voltage source or, in the case of alternating voltage, to an outer conductor. See, for example, indicated between reference signs 9a and 6 in FIG. 2.

All features disclosed in the application documents are claimed as essential to the invention, provided that they are, individually or in combination, novel over the prior art.

LIST OF REFERENCE SIGNS 1 power module
2 power electronics unit
3, 4 layer
3a first side
3b second side
5 boundary
6 connection
9 connection
10 compensation layer

The invention claimed is:

1. A power module having reduced intrinsic inductance, comprising:
   an at least partially electrically insulating layer that has a first surface on which a power electronics unit is arranged and a second surface which is opposite the first surface; and
   a compensation layer is arranged on the second surface; wherein:
   the compensation layer is electrically conductive and electrically connected to an electric potential of the power electronics unit; and
   the compensation layer is divided into a plurality of portions, these portions being electrically insulated from one another and to allow different electric potentials, the different electric potentials having opposite polarity signs, to be applied to these portions.

2. The power module according to claim 1, wherein:
   the power electronics unit substantially has a layer structure, the layer structure preferably comprising a layer selected from a group comprising silicon, silicon carbide, and gallium nitrite.

3. The power module according to claim 1, wherein:
   the insulating layer is at least substantially planar and preferably extends parallel to a layer of the power electronics unit.

4. The power module according to claim 1, wherein: the compensation layer is electrically connected to an electric potential of a switch of the power electronics unit.

5. The power module according to claim 1, further comprising: a plurality of at least partially electrically insulating layers, each of these layers having, on a second surface of the power electronics unit,
   a further compensation layer, wherein the further compensation layer is electrically conductive and another electric potential is applicable to the further compensation layer.

6. The power module according to claim 1, wherein:
   at least a portion of the compensation layer has a geometry shaped and configured to correspond to the power electronics unit.

7. The power module according to claim 1, wherein:
   the compensation layer is thermally conductive and is thermally connected to a heat sink in order to dissipate heat from the power electronics unit.

8. A method for producing a power module, comprising the steps of:
   providing a power electronics unit comprising an at least partially electrically insulating layer which has a first surface that faces a power electronics and an opposite second surface that faces away from the power electronics,
   depositing an electrically conductive compensation layer on the second surface of the at least partially electrically insulating layer,
   electrically connecting the compensation layer to an electric potential of the power electronics unit,
   dividing the compensation layer into a plurality of portions, the plurality of portions being electrically insulated from one another and configured to allow different electric potentials, and
   applying different electric potentials having opposite polarity signs to the plurality of portions.

9. The method according to claim 8, wherein:
   the compensation layer is electrically connected to a pole of a direct voltage source or an outer conductor.

* * * * *